United States Patent [19]

Mori et al.

[11] Patent Number: 4,801,801
[45] Date of Patent: Jan. 31, 1989

[54] TRANSMISSION-TYPE ELECTRON MICROSCOPE

[75] Inventors: Nobufumi Mori; Junji Miyahara, both of Kaiseimachi; Tetsuo Oikawa; Yoshiyasu Harada, both of Akishima, all of Japan

[73] Assignees: Fuji Photo Film Co., Ltd., Kanagawa; JEOL Ltd., Tokyo, both of Japan

[21] Appl. No.: 59,501

[22] Filed: Jun. 8, 1987

[51] Int. Cl.$^4$ .................. G01N 23/04; H01J 37/22
[52] U.S. Cl. .................. 250/327.2; 250/397
[58] Field of Search ............ 250/397, 311, 337, 327.2, 250/484.1

[56] References Cited

U.S. PATENT DOCUMENTS 3,857,035  12/1974  Miller .................. 250/338
4,651,220   3/1987  Hosoi et al. .......... 358/256

FOREIGN PATENT DOCUMENTS 0168838  7/1984  European Pat. Off.
0178672  4/1986  European Pat. Off. ........ 250/311

*Primary Examiner*—Janice A. Howell
*Assistant Examiner*—Constantine Hannaher
*Attorney, Agent, or Firm*—Webb, Burden, Ziesenheim & Webb

[57] ABSTRACT

A transmission-type electron microscope comprises a lens system including an electron gun for producing an electron beam that is focused and directed to a specimen. The lens system forms a magnified electron optical image of the specimen from the electron beam transmitted through the specimen. A two-dimensional sensor is mounted in the plane in which the magnified image is formed, the sensor acting to store the energy of the electron beam impinging on it and to release the stored energy as light when illuminated with light or heated. An electron beam-deflecting means is mounted in the lens system and acting to tilt the focal plane in which the magnified lens image is formed, in such a way that a straight line extending from the main optical axis of the electron beam between the electron gun and the specimen does not interset the two-dimensional sensor.

7 Claims, 1 Drawing Sheet

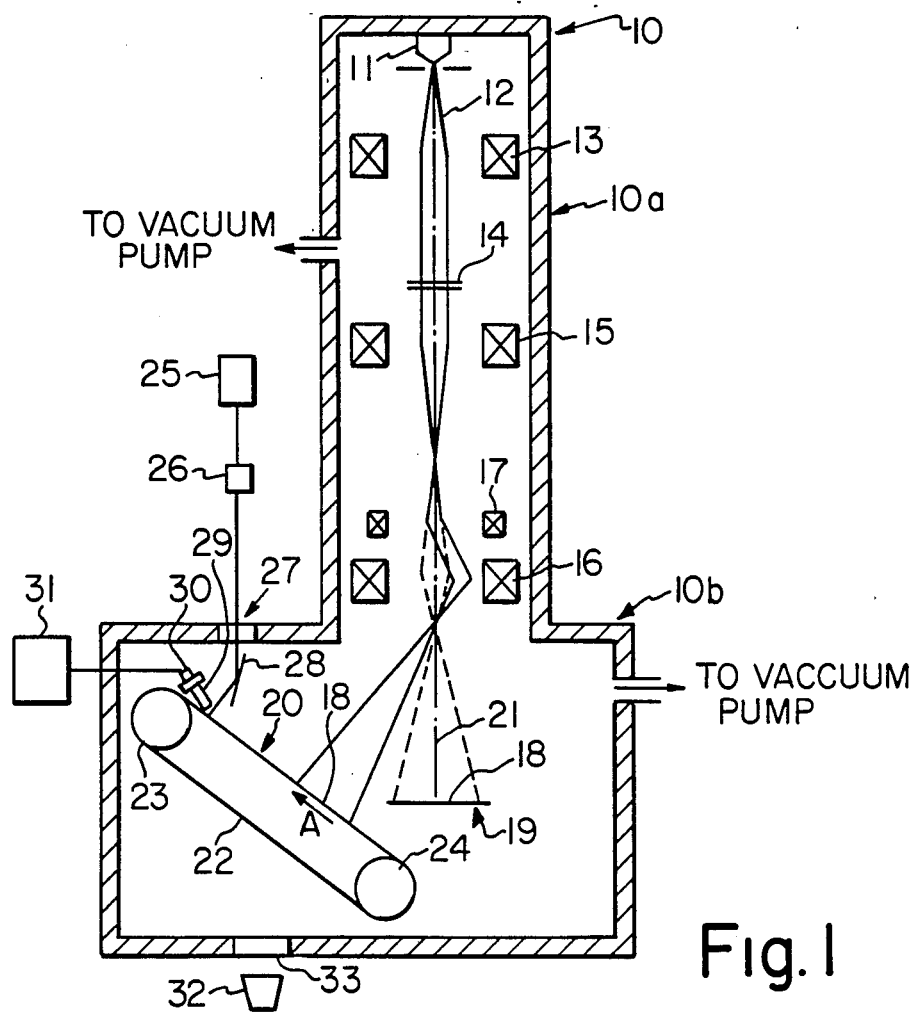
Fig. 1
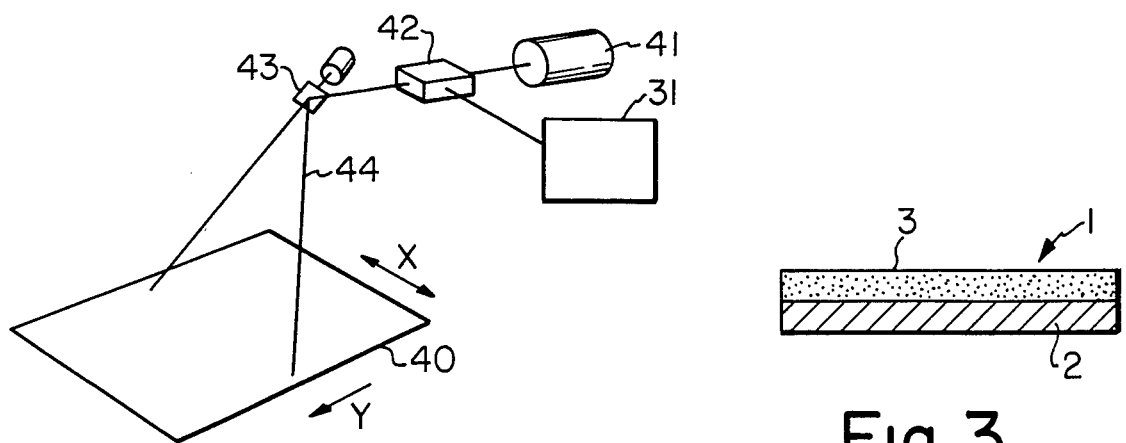
Fig. 2
Fig. 3

TRANSMISSION-TYPE ELECTRON MICROSCOPE

FIELD OF THE INVENTION

The present invention relates to a transmission-type electron microscope and, more particularly, to a transmission-type electron microscope which is highly sensitive and capable of producing electron micrographs of high quality.

BACKGROUND OF THE INVENTION

In general, in a transmission-type electron microscope, a specimen is irradiated with an electron beam that is focused by condenser lenses. The beam penetrates the specimen, and forms a diffraction pattern of the specimen in the back focal plane of the objective lens. Then, the diffracted electrons are again caused to interfere with each other to produce a magnified image of the specimen. When this magnified image is projected onto a fluorescent screen through projector lenses, a magnified transmission image of the specimen can be observed. When the back focal plane of the objective lens is projected, a magnified diffraction pattern of the specimen can be observed. Where intermediate lenses are mounted between the objective lens and the projector lenses, either a magnified transmission image or a diffraction pattern can be obtained by adjusting the focal length of the intermediate lenses. One conventional method of observing such a magnified transmission image or diffraction pattern (hereinafter referred to as a "transmission electron optical image"), is to place a sheet of photographic film in the focal plane of the projector lenses and to expose the film with the transmission electron optical image. Another conventional means is to use an image intensifier for magnifying the projected transmission electron optical image. (European Patent Application No. 0168838)

However, the sensitivity of photographic film to electron beams is low. In addition, it is laborious to develop the film. Also, the use of an image intensifier introduces the problem that the sharpness of the image is low. Further, the image tends to be distorted.

Recently, a quite sensitive two-dimensional sensor has been proposed. This sensor stores the energy of the electron beam impinging on it. Then, the sensor is exposed to light or heated so that it emits light in proportion to the stored energy.

FIG. 3 is a cross-sectional view of a stimulable phosphor sheet adapted for the above-described two-dimensional sensor, the sheet being stimulated by stimulating rays. The stimulable phosphor sheet, indicated by numeral 1, comprises a support 2 and a stimulable phosphor layer 3 formed on the base 2. The base 2 can be a sheet of polyethylene or plastic film of about 100 to 200 $\mu$m thick, a sheet of aluminum of 0.5 to 1 mm thick, a sheet of glass of 1 to 3 mm thick, or the like. The base 2 may or may not be transparent. Where the base is opaque, the light emitted from the stimulable phosphor sheet is detected from the same side as the stimulating rays impinged. Where the base is transparent, the emitted light can be detected from the same side the stimulating rays impinged from the opposite side to the stimulating rays impinged on both sides.

The stimulable phosphor used in stimulable phosphor sheet of the two-dimensional sensor employed in the present invention can be:

$$(Ba_{1-x-y}, Mg_x, Ca_y) FX:\alpha Eu^{2+} \tag{1}$$

where X is at least one of Cl and Br; x and y satisfy the conditions $0 < x + y \leq 0.6$ and $xy \neq xy\ 0$; and $\alpha$ satisfies the condition $10^{-6} \leq \alpha 5 \times 10^{-2}$. This is described in Japanese Patent Unexamined Laid Open No. 12143/1980.

$$LnOX : xA \tag{2}$$

where Ln is at least one selected from the group consisting of La, Y, Gd, and Lu; X is at least one of Cl and Br; A is at least one of Ce and Tb; and x satisfies the condition $0 < x < 0.1$. This is described in U.S. Pat. No. 4,236,078.

$$M^\pi FX \cdot XA: yLn \tag{3}$$

where $M^\pi$ is at least one selected from the group consisting of Ba, Ca, Sr, Mg, Zn, and Cd; A is at least one selected from the group consisting of BeO, MgO, CaO, SrO, BaO, ZnO, Al$_2$O$_3$, Y$_2$O$_3$, La$_2$O$_3$, In$_2$O$_3$, SiO$_2$, TlO$_2$, ZrO$_2$, GeO$_2$, SnO$_2$, Nb$_2$O$_5$, Ta$_2$O$_5$, and ThO$_2$; Ln is at least one selected from the group consisting of Eu, Tb, Ce, Tm, Dy, Pr, HO, Nd, Yb, Er, Sm, and Gd; X is at least one selected from the group consisting of Cl, Br, and I; x satisfies the condition $5 \times 10^{-5} < X \leq 0.5$; and y satisfies the condition $0 < y \leq 0.2$. This stimulable phosphor is described in U.S. Pat. No. 4,539,138.

$$BaFX \cdot xNaX':\alpha Eu^{2+} \tag{4}$$

where each of X and X' is at least one of Cl, Br, and I; x satisfies the condition $0 < x \leq 2$; and $\alpha$ satisfies the condition $0 < \alpha \leq 0.2$. This stimulable phosphor is described in Japanese Patent Unexamined Laid Open No. 56479/1984.

$$M^\pi X_2 \cdot aM^\pi X'_2 : xEu^{2+} \tag{5}$$

where $M^\pi$ is at least one alkaline-earth metal selected from the group consisting of Ba, Sr, and Ca; each of X and X' is at least one halogen selected from the group consisting of Cl, Br, and I; X and X' are different halogens ($X \neq X'$); $a$ is a numerical value satisfying the condition $0.1 \leq a \leq 10.0$; x is a value satisfying the condition $0 < x \leq 0.2$. This stimulable phosphor is described in Japanese Patent Application No. 84381/1985 (U.S. patent Ser. No. 834,886), and can contain an additive as described in Japanese Patent Application No. 166379/1985 (correspond to European patent application No. 151,494) or 221483/1985 (U.S. Ser. No. 947,631, European Patent Application No. 159,014).

Other usable storage-type fluorescent substances are described in U.S. Pat. Nos. 3,859,527, 4,236,078, 4,239,968, 4,505,989 and Japanese patent application Nos. 116777/1981, 23673/1982, 23675/1982, 69281/1983, 206678/1983 (U.S. Ser. No. 841,044, European Patent Application No. 95741), 27980/1984 (European Patent Application No. 101,030), 47289/1984 (European Patent Application No. 103,302), 752200/1984 (European Patent Application No. 107,192), and 101173/1985. Any one of these storage-type fluorescent substances dispersed in a suitable binder and applied to the support 2 up to a thickness of 1000 microns. If stimulable phosphor layer can sustain itself, it can form stimulable phosphor sheet by itself.

When a stimulable phosphor sheet formed in this way is exposed to an electron beam or other radiation, some of the energy of the radiation is stored in the stimulable phosphor. Subsequently, the sheet is exposed to stimulating rays such as visible light. As a result, the fluorescent substance fluoresces according to the stored energy. Instead of the stimulable phosphor stimulated by light, a thermal phosphor can be used which releases the stored energy when heated after it stores radiation energy. In this case, the thermal phosphor is sulfate, such as $Na_2SO_4$, $MnSO_4$, $CaSO_4$, $SrSO_4$, or $BaSO_4$, to which a trace of at least one of the additives Mn, Dy, and Tm, is added. The thermal phosphor sheet is fabricated in the same manner as the aforementioned stimulable phosphor sheet.

A two-dimensional sensor made of the abovedescribed stimulable phosphor sheet or thermal phosphor sheet is placed in the focal plane of an electron microscope. A transmission electron optical image is stored in this sensor, which is scanned either with stimulating rays such as visible light r with a heat source so that it may emit light. The resulting emitted light is detected photoelectrically. As a result, an electric signal corresponding to the transmission electron optical image can be obtained. The signal derived in this way can be fed to a display unit such as a CRT to make visible the electron optical image, or it can be permanently recorded in the form of hard copy. It is also possible to temporarily store the image signal on a recording medium such as magnetic tape or magnetic disk.

When the aforementioned two-dimensional sensor is used, a black spot is developed at the center of the produced image. This phenomenon does not occur when the conventional photographic film is employed. The occurance of such a phenomenon is now explained. The sensitivity of the two-dimensional sensor is much higher than that of the conventional photographic film. Therefore, the image of the filaments of the electron gun installed on the main optical axis of the electron beam in the upper portion of the electron microscope is recorded, or the electrons emanating from the filaments are scattered by the apertures and the specimen installed on the optical axis, giving rise to other radiation, such as X-rays. Hence, the black spot appears.

SUMMARY OF THE INVENTION

In view of the foregoing problems with the prior art techniques, it is an object of the present invention to provide a highly sensitive electron microscope in which the recording medium consists of stimulable phosphor two-dimensional sensor that is quite sensitive to electron beams or the like but free of a black center spot.

This object is achieved by a transmission electron microscope comprising: a lens system including an electron gun for producing an electron beam that is focused and directed to a specimen, the lens system also acting to form a magnified electron optical image of the specimen from the electron beam transmitted through the specimen; a two-dimensional sensor mounted in the plane in which the magnified image is formed, the sensor acting to store the energy of the electron beam impinging on it and to release the stored energy as light when illuminated with light or heated; an evacuated envelope in which the lens system and the two-dimensional sensor are housed; and an electron beam-deflecting means mounted in the lens system and acting to tilt the focal plane in which the magnified image is formed, in such a way that a straight line extending from the main optical axis of the electron beam between the electron gun and the specimen does not intersect the two-dimensional sensor. This structure prevents the occurrence of a black center spot on the two-dimensional sensor.

BRIEF DESCRIPTION OF THE DRAWINGS

FIG. 1 is a cross-sectional view of a stimulable phosphor sheet for use in the present invention;

FIG. 2 is a block diagram of the whole structure of an electron microscope according to the invention; and FIG. 3 is a schematic perspective view of an image recorder for use in the invention.

DESCRIPTION OF THE PREFERRED EMBODIMENT

Referring to FIG. 1, there is shown a transmission-type electron microscope embodying the concept of the present invention. The microscope, generally indicated by reference numeral 10, consists of a microscope body section 10a and a record-and-display section 10b. The body portion 10a protrudes vertically from the record-and-display portion 10b. More specifically, the microscope comprises an electron gun 11 for producing an electron beam 12, condenser lenses 13, an objective lens 15, projector lenses 16, a deflecting means 17, a stimulable phosphor sheet 22, a driving roller 23, a driven roller 24, a light source 25 for producing stimulating rays, a light deflector 26, a mirror 28, a light guide 29, a photoelectric device 30, an image-processing circuit 31, and a light source 32 for producing erasing light. A specimen 14 is placed in the microscope. The electron beam makes focused images in planes 19 and 20. A magnified transmission electron optical image 1 of the specimen is produced in the plane 19. The main optical axis of the electron beam is indicated by numeral 21. The envelope of the microscope has wall portions 27 and 33 transparent to light.

The microscope 10 is maintained in a vacuum by a known means (not shown) while in operation. The electron beam 12 emitted by the electron gun 11 is accelerated and then focused by the condenser lenses 13. The focused beam impinges on the specimen 14. The electron beam transmitted through the specimen 14 is refracted by the objective lens 15 and the projector lenses 16 to form the magnified image 18 of the specimen 14.

When the deflecting means 17 is not in operation, the magnified image 18 is projected by the projector lenses 16 onto the focal plane 19 which lies on the straight line interconnecting the electron gun 11 and the specimen 14, as indicated by the broken lines. A sheet of ordinary photographic film is placed in the focal plane 19 and so it is unlikely that a visible black spot is formed at the center S of the plane 19 lying on the main optical axis 21; rather the electron microscope permits one to make microscopic observations and take electron micrographs of the specimen in a conventional manner. It is not always necessary to place a sheet of photographic film in the focal plane 19. Only a two-dimensional sensor may be used to make observations and take electron micrographs of the specimens.

When the deflecting means 17 is operated, the electron beam 12 is deflected as indicated by the solid lines. This moves the focal plane 20 away from the main optical axis 21. The stimulable phosphor sheet 22 which is shaped into an endless belt is placed in the focal plane 20. The sheet 22 can be moved by the driving roller 23 and the driven roller 24. The magnified image 18 is recorded on this sheet 22. Since the focal plane 20 is located off the main optical axis 21, no black spot is formed at the center of the image. After finishing the recording, the roller 23 is driven to move the stimulable phosphor sheet 22 to read the recorded image. For this purpose, the light source 25 consisting of a He-Ne laser, a semiconductor laser, or the like produces a stimulating laser beam, which is deflected by the light deflector 26 such as a galvanometer mirror. The beam then passes through the transparent wall portion 27, is reflected by the mirror 28, and hits the stimulable phosphor sheet 22. The transparent wall portion 27 is made of lead glass, for example. Thus, the sheet 22 is scanned with the light beam that traverses the surface of the sheet 22, which is hereinafter referred to as the main scan. At the same time, the belt 22 is moved by the driving roller 23 in the longitudinal direction indicated by the arrow A, i.e., perpendicularly to the direction in which the beam moves on the belt 22. That is, the belt is scanned with the light beam longitudinally, which is hereinafter referred to as the subsidiary scan. The stimulable phosphor sheet 22 that is exposed to the stimulating rays and the resulting light enters the light collector 29 from the incident end surface of the collector 29 that faces the sheet 22. The light is then repeatedly reflected totally by the inside wall of the light guide 29, moves down the inside of the light guide, and leaves it from the exit end surface of the light guide. Then, the light passes through a filter (not shown) for removing the stimulating rays and strikes the photoelectric device 30 such as a photomultiplier. In this way, the amount of the emitting light is detected photoelectrically.

The electric image signal delivered from the photoelectric device 30 is fed to the image-processing circuit 31, where the image signal is subjected to the requisite processings. The output signal from the circuit 31 is supplied to a display unit (not shown), such as a CRT, or a recorder in which a sheet of sensitive film is scanned with light. In this way, the electric image signal which varies according to the amount of the fluorescent light is fed to the display unit (not shown) to make the magnified transmission image visible.

The portion of the stimulable phosphor sheet 22 from which image information was taken is transported into an erasing zone, where it is illuminated with the erasing light. More specifically, the light source 32 for producing the erasing light is mounted outside of the evacuated envelope. The light emanating from the light source 32, such as a fluorescent lamp, passes through the transparent wall portion 33 and strikes the stimulable phosphor sheet 22. This erasing light contains the frequency range of the stimulating rays, in order to remove the image remaining in the stimulable phosphor layer of the sheet 22 and to eliminate the artifacts caused by the radioactive elements contained in the raw material of the sheet 22. The light source 32 can be a tungsten lamp, halogen lamp, infrared lamp, xenon flash tube, laser, or the like.

In the above example, the stimulable phosphor sheet is shaped into an endless belt, but the stimulable phosphor sheet is not limited to this form. Rather, it can take various forms. For instance, it can comprise a base in the form of an endless belt and a plurality of stimulable phosphor sheets held on the base.

Also in the above example, the deflecting means 17 is mounted at the front side of the projector lenses 16. It may also be mounted at the back of the projector lenses.

FIG. 2 shows one example of the aforementioned image recorder. Shown in this figure are the imageprocessing circuit 31 (see FIG. 2), a sheet of sensitive film 40, a laser 41, an optical modulator 42, a light deflector 43, and a laser beam 44.

The sheet of sensitive film 40 is fed in the direction indicated by the arrow Y to make a subsidiary scan. At the same time, the laser beam 44 is deflected by the deflector 43 so that the sheet of film 40 may be scanned with the beam moving in the direction indicated by the arrow X, in order to make a main scan. Since the beam 44 is deflected by the deflector 43 in accordance with the image signal produced by the image-processing circuit 31, a magnified visible transmission image is formed on the sheet of film 40.

The size of the visible image formed on the sheet of film 40 is made larger than the size of the image which is formed in the focal plane 20 (FIG. 2) and stored in the sheet 22. Therefore, the visible image is larger than the image formed in the focal plane 20. Since the image is formed on the stimulable phosphor sheet with high sharpness, the image quality is sufficiently high in spite of such a magnification. Hence, the stimulable phosphor sheet 22 can be fabricated in small size. This makes it possible to use a smallsized photoelectric device as the device 30. Consequently, the whole instrument can be rendered small.

In order to output an enlarged image by the image scanning recording apparatus as shown in FIG. 3, density or pitch of the scanning lines at the time of reproducing images is made lower or larger than that at the time or reading out the image from the stimulable phosphor sheet 22. In order to obtain sufficient amount of information of images from the small size of stimulable phosphor sheet, it is desirable to make the density or pitch of the scanning lines at the time of reading out images not more than 10 pixel/mm or more preferably in the range or 15 to 100 pixel/mm. In the case of reproducing images, the density or pitch of the scanning lines is desired to be made lower or larger than that used for reading out images in the range of 5 to 20 pixel/mm, whereby it is possible to reproduce an enlarged image without lowering the quality of the image.

In the above example, a magnified transmission image of a specimen is recorded by the use of a penetrating electron beam. Obviously, the invention is also applicable to the case where the aforementioned diffraction pattern created by a specimen is recorded.

In order that the electron microscope be unaffected by the variations in the recording conditions or that the microscope permit the operator to make good observations of the specimen, it is desired to know the recording pattern which depends on the condition of the transmission electron optical image stored in the stimulable phosphor sheet, the nature of the specimen, and the way in which the image is recorded, before a visible image of the specimen is obtained. The electric image signal should be amplified by an appropriate factor or otherwise be processed, according to the known recording pattern. Also, the scale factor of the instrument should be determined in such a way that the density resolution is optimized, according to the contrast of the recording pattern. This allows one to observe the produced image easily.

In order to take information on the stored image from the stimulable phosphor sheet before a visible image is obtained as mentioned above, the information previously stored in the stimulable phosphor sheet should be read, using a stimulating ray of a lower energy. Then, a visible image of the specimen should be obtained, using an exciting radiation of a higher energy. At this time, the derived electric signal is amplified or otherwise processed and the scale factor of the instrument is determined, according to the information read first.

Also in the example described above, the photoelectric device for detecting the light emitting from the stimulable phosphor sheet is a photomultiplier. This can be replaced by a solid-state photodetector such as a photoconductor or photodiode. In this case, a large number of solid-state photoelectric elements may be arranged on or in close proximity to the whole surface of the sheet. Also, the photoelectric device can consist of a plurality of photoelectric elements arranged in a row. In a further modified example, solid-state photoelectric elements are disposed on the whole surface of the stimulable phosphor sheet in such a manner that each element corresponds to one pixel. These photoelectric elements are moved to scan the sheet.

The light source for producing stimulating rays to read information can be either a point source, such as a laser, or a line source, such as an array of light-emitting diodes or semiconductor lasers. The use of such a light source for the reading prevents the loss of the light emitting from the stimulable phosphor sheet and increases the solid angle at which the light is received. This in turn enhances the signal-to-noise ratio. The stimulating ray is not caused to strike the stimulable phosphor sheet as instants regularly spaced in time, but the output signal from the photodetector is electrically processed on a time-series basis. Hence, data can be read at a higher rate than conventional. Furthermore, the radiation image storage panel may be reciprocated between various sections including the focal plane, the reading section, and the erasing section. The sheet also may be made stationary at the position of the focal place, and data may be read and erased at this location.

Where a thermal phosphor sheet is used as the two-dimensional sensor, the sheet is not illuminated with light but heated to release the energy stored in the sheet. For this purpose, a $CO_2$ laser or the like is employed as the heat source. The sheet is scanned with the heat rays produced from this heat source.

It is not always necessary that the image be read while the two-dimensional sensor such as a stimulable phosphor sheet is placed in a vacuum. As an example, an electron optical image is stored, and then the vacuum is broken. The two-dimensional sensor is taken out of the microscope. The image is made visible by an image recorder mounted independent of the microscope. However, when a two-dimensional sensor is repeatedly used within the evacuated system containing the focal plane in which an electron optical image is focused, a number of pictures can be taken successively without breaking the vacuum. In the conventional method using a sheet of film, it was necessary to break the vacuum to exchange the film for new one.

As can be understood from the description made thus far, in the novel instrument, the electron beam emitted from the electron gun is focused and directed to a specimen. The transmission electron optical image of the specimen is magnified and projected by the lens system which is equipped with a deflecting means at a certain position to deflect the electron beam directed to the specimen. Thus, the focal plane on the two-dimensional sensor is located off the main axis of the electron beam extending between the electron gun and the specimen. Therefore, no black spot is formed at the center of the image on the sensor, and the sensor can be used as a highly sensitive recording medium. This permits a decrease in the electron dose absorbed by the specimen, whereby the specimen is less damaged. Also, the recorded image can be quickly visualized faithfully on a CRT or the like. If this visible image is used to adjust the focus of the microscope, then it follows that a clear monitor image is available. This permits adjustment of the focus at low electron dose levels, which would have been heretofore impossible to achieve. The electron optical image is converted into an electric signal, which can very readily undergo image processing, including gradation processing operation and frequency enhancement. Additionally, the processing of a diffraction pattern, the reconstruction of a three-dimensional image, and image analysis such as digitization of the image signal can be done with greater ease than heretofore, as mentioned above. Furthermore, the two-dimensional sensor for storing an electron optical image can be re-used by being illuminated with light, heated, or otherwise processed. Consequently, electron micrographs can be taken more economically than the case where silver-halide photographic film is used.

Having thus described the invention with the detail and particularity required by the Patent Laws, what is claimed and desired protected by Letters Patent is set forth in the following claims.

1. A transmission-type electron microscope comprising:
a lens system including an electron gun for producing an electron beam that is focused and directed to a specimen along a main optical axis extending from the gun to the specimen, the lens system also acting to form a magnified electron optical image of the specimen from the electron beam transmitted through the specimen at a focal plane perpendicular to the optical axis;
a two-dimensional sensor mounted in the plane in which the magnified image is formed, the sensor acting to store the energy of the electron beam impinging on it and to release the stored energy as light when illuminated with light or heated;
an evacuated envelope containing the lens system which protrudes vertically from an evacuated envelope containing the two-dimensional sensor; and
an electron beam-deflecting means mounted in the lens system near the specimen end of the main optical axis for tilting the focal plane in which the magnified image is formed, in such a way that a straight line extending from the main optical axis of the electron beam between the electron gun and the specimen does not intersect the two-dimensional sensor.

2. The transmission-type electron microscope of claim 1, wherein said two-dimensional sensor is a stimulable phosphor sheet.

3. The transmission-type electron microscope of claim 2, wherein said stimulable phosphor sheet is scanned with an stimulating rays which enters the microscope from outside through a transparent wall portion.

4. The transmission-type electron microscope of claim 3, wherein the light emitting from the suitable phosphor sheet is detected by a photoelectric device that is disposed opposite to the sheet.

5. The transmission-type electron microscope of claim 4, wherein a filter is disposed in front of the photoelectric device to remove the stimulating rays.

6. The transmission-type electron microscope of claim 2, wherein the stimulable phosphor sheet is illuminated with erasing light produced from an external light source, the erasing light entering microscope through a transparent wall portion.

7. The transmission-type electron microscope of claim 1, wherein said two-dimensional sensor is thermal phosphor sheet.

* * * * *

UNITED STATES PATENT AND TRADEMARK OFFICE
CERTIFICATE OF CORRECTION

PATENT NO. : 4,801,801

DATED : January 31, 1989

Page 1 of 2

INVENTOR(S) : Nobufumi Mori, Junji Miyahara, Tetsuo Oikawa and Yoshiyasu Harada

It is certified that error appears in the above-identified patent and that said Letters Patent is hereby corrected as shown below:

In the Abstract Line 13 after "magnified" delete --lens--.

In the Abstract Line 16 "interset" should read --intersect--.

Column 1 Line 39 after "0168838)" insert --.--.

Column 2 Line 6 before "5" insert --$\leq$--.

Column 2 Line 26 "HO" should read --$H_O$--.

Column 2 Line 28 "X" should read --x--.

Column 3 Lines 16-17 abovede-scribed" should read --above-described--.

Column 3 Line 21 "r" should read --or--.

UNITED STATES PATENT AND TRADEMARK OFFICE
CERTIFICATE OF CORRECTION

PATENT NO. : 4,801,801

DATED : January 31, 1989

INVENTOR(S) : Nobufumi Mori, Junji Miyahara, Tetsuo Oikawa and Yoshiyasu Harada

Page 2 of 2

It is certified that error appears in the above-identified patent and that said Letters Patent is hereby corrected as shown below:

Column 4 Line 34 "1" should read --18--.

Column 5 Line 68 "imageproc-essing" should read --image-processing--.

Column 6 Line 23 "smallsized" should read --small-sized--.

Column 6 Line 36 "or" should read --of--.

Column 7 Line 56 after "for" insert --a--.

Claim 3 Column 8 Line 58 "an" should read --a--.

Claim 6 Column 9 is "Double Spaced" should be --Single Spaced--.

Signed and Sealed this

Twenty-ninth Day of August, 1989

Attest:

DONALD J. QUIGG

Attesting Officer

Commissioner of Patents and Trademarks